United States Patent
Adams et al.

[11] Patent Number: 5,991,061
[45] Date of Patent: Nov. 23, 1999

[54] LASER TRANSMITTER FOR REDUCED SBS

[75] Inventors: Laura Ellen Adams, Basking Ridge; Clyde George Bethea, Franklin, both of N.J.; Lars Erik Eskildsen, Lyngby, Denmark; Gerald Nykolak, Long Beach Long Island, N.Y.; Roosevelt People, Plainfield, N.J.; Tawee Tanbun-Ek, Califon, N.J.

[73] Assignee: Lucent Technologies Inc., Murray Hill, N.J.

[21] Appl. No.: 08/954,576

[22] Filed: Oct. 20, 1997

[51] Int. Cl.$^6$ .......................... H04B 10/01; H04B 10/12; H01S 3/08

[52] U.S. Cl. .......................... 359/188; 359/180; 372/96; 385/14

[58] Field of Search .......................... 359/180, 173, 359/188; 372/96; 385/14

[56] References Cited

U.S. PATENT DOCUMENTS

| | | | |
|---|---|---|---|
| 5,329,396 | 7/1994 | Fishman et al. | 359/173 |
| 5,359,450 | 10/1994 | Ramachandran et al. | 359/188 |
| 5,420,868 | 5/1995 | Chraplyvy et al. | 370/122 |
| 5,473,625 | 12/1995 | Hansen et al. | 372/96 |
| 5,477,368 | 12/1995 | Eskildsen et al. | 359/188 |
| 5,566,381 | 10/1996 | Korotky | 359/183 |
| 5,606,573 | 2/1997 | Tsang | 372/96 |

FOREIGN PATENT DOCUMENTS

| | | | |
|---|---|---|---|
| 0169567 | 1/1986 | European Pat. Off. | H01S 3/10 |
| 0189252 | 7/1986 | European Pat. Off. | H01S 3/103 |
| 762577A1 | 3/1997 | European Pat. Off. | H01S 3/103 |
| 2309607 | 7/1997 | United Kingdom | H01S 10/18 |

OTHER PUBLICATIONS

T. Tanbun–Ek et al., Broad–Band Tunable Electroabsorption . . . , IEEE J. of Selected Topics in Quantum Electr., vol. 3, No. 3, pp. 960–966 (Jun., 1997).

G. C. Wilson et al., Predistortion of Electroabsorption Modulators for Analog . . . , vol. 15, No. 9, pp. 1654–1661 (Sep. 1997).

J. Salzman et al., Distributed Feedback Lasers with an S–Bent Waveguide . . . , IEEE J. of Selected Topics in Quantum Electr., vol. 1, No. 2, p. 346–355 (Jun., 1995).

H. Nakajima et al., Very high speed wavelength switching capability Franz–Keldysh electroabsorption DFB lasers, OFC '96 Technical Digest, p. 276 (1996).

T. Numai, 1.5–βm Wavelength Tunable Phase–shift Controlled Distributed Feedback Laser, J. Lightwave Tech., vol. 10, No. 2, pp. 199–205 (1992)

W.T. Tsang et al., Control of Lasing Wavelength in Distributed Feedback Laser by Angling the Active Stripe with Respect to the Grating, IEEE Photonics Tech. Lett., vol. 5, No. 9, pp. 978–980 (1993).

H. Nakajima et al., Absorption–controlled tunable DFB amplifier–filters, Electronic Lett., vol. 30, No. 16, pp. 1294–1296 (1994).

H. Hillmer et al., Tailored DFB Laser Properties by Individually Chirped Gratings Using Bent Waveguides, IEEE J. Selected Topics in Quantum Electronics, vol. 1, No. 2, pp. 356–362 (1995).

H. Nakajima et al., Very high speed wavelength switching capability Franz–Keldysh electroabsorption DFB lasers, OFC '96 Technical Digest, p. 276 (1996).

(List continued on next page.)

*Primary Examiner*—Kinfe-Michael Negash
*Attorney, Agent, or Firm*—Eugen E. Pacher

[57] ABSTRACT

A tunable semiconductor laser comprises a gain section having an MQW active region, a uniform pitch grating DFB region, and first waveguide. A composite reflector, including a second MQW region and a second waveguide, forms a cavity resonator with the DFB region. A tuning voltage applied to the composite reflector induces refractive index changes, thereby allowing the center wavelength to be altered. A dither signal applied the composite reflector broadens the spectrum of the laser output, thereby reducing SBS in fiber optic systems.

7 Claims, 3 Drawing Sheets

OTHER PUBLICATIONS

L. E. Adams et al., System Performance of High–Speed Broadband–Tunable Laser for Wavelength Conversion in WDM Networks, OFC '97, Postdeadline Paper No. PD11, pp. 1–4 (1997).

T. Tanbum–Ek et al., Tunable Electroabsorption Modulated Laser Integrated with a Bent Waveguide Distributed–Feedback Laser, IEEE Photonics Tech. Lett., vol. 9, No. 5, pp. 563–565(1997).

P.B. Hansen et al., SBS suppression using temperature wavelength–modulated laser diode with low residual AM, OFC '96 Technical Digest, Paper FR4, pp. 302–303 (1996).

T. Franck et al., Experimental Verification of SBS Suppression by Duobinary Modulation, ECOC 97, Conference Publication No. 448, pp. 71–74 (Sep. 22–25, 1997).

T. Franck et al., Novel Duobinary Transmitter, ECOC 97, Conference Publication No. 448, pp. 67–70 (Sep. 22–25, 1997).

LASER TRANSMITTER FOR REDUCED SBS

CROSS-REFERENCE TO RELATED APPLICATIONS

This application was concurrently filed with application Ser. No. 08/954,405 entitled Broadband Tunable Semiconductor Laser Source (Adams 1-16-1-6-5-2-11 -57), with application Ser. No. 08/954,575 entitled Sub-Carrier Multiplexing in Broadband Optical Networks (Adams 2-17-7-6-12), and with application Ser. No. 08/954,022 entitled Laser Transmitter for Reduced Signal Distortion (Adams 3-18-8-7-13).

FIELD OF THE INVENTION

This invention relates generally to laser transmitters and, more particularly, to broadband, tunable semiconductor laser transmitters which reduce stimulated Brillouin scattering (SBS) in fiber optic systems.

BACKGROUND OF THE INVENTION

SBS is one of many nonlinear phenomena which can adversely affect system performance in fiber optic systems. Brilouin scattering within a silica optical fiber results from photons being scattered by localized refractive index variations induced by acoustic (i.e., sound) waves. These refractive index variations are caused by acoustic vibrations in the silica lattice that makes up the fiber core. Furthernore, owing to the dependence of refractive index on light intensity in the nonlinear regime, the presence of intense light in the fiber will also induce lattice vibrations which, in turn, induce acoustic waves, that then scatter more light. When the SBS threshold power is exceeded (as low as about 10 mW per channel in some WDM systems), light from an intense forward propagating signal (e.g., the transmitted signal) can provide gain for (i.e., stimulate) a backward propagating signal (known as a Stokes signal). In this fashion, the Stokes signal can degrade the transmitted signal significantly.

Yet many applications require that the transmitted signal be launched at relatively high power, and anything, including SBS, which limits the maximum launch power presents a problem. For example, limiting the launch power reduces the allowable un-repeatered span length in fiber optic transmission systems, as well as the number of splits (or fanouts) which can be utilized in a fiber-based distribution system (e.g., a CATV system). One way to alleviate this problem is to increase the power at which the onset of SBS occurs (i.e., increase the SBS threshold). This threshold is arbitrarily defined as the level of launched optical power at which the power of the backward Stokes signal becomes equal to the power of the Rayleigh scattered signal; i.e., the total reflected power has doubled.

The prior art has devised numerous schemes for increasing the SBS threshold, but none is entirely satisfactory. Most of these schemes rely on the fact that the efficiency for SBS decreases as the linewidth of the transmitted signal source is increased. Consequently, artificially broadening the spectrum of that source via modulation serves to increase the SBS threshold. One approach calls for an external phase modulator to modulate the output of a laser transmitter, thereby broadening the spectrum of the transmitted signal by randomly changing its phase. A second approach utilizes wavelength dithering or detuning. A small specialized heating element is used to change the local laser temperature and thus its wavelength by a small amount. The frequency of the wavelength dither is on the order of a few kilohertz. however, these approaches require complex or high-voltage driving waveforms to broaden the spectrum. Alternatively, small-signal direct modulation of a DFB laser transmitter has also been suggested. But, when relatively large SBS thresholds are required, this approach results in substantial amplitude modulation (AM) which may degrade system performance. Another prior art approach, significantly different in that it does not involve artificially broadening the transmitted signal spectrum, suppresses SBS by applying duobinary modulation to the transmitted signal. Due to the absence of an optical carrier in the spectrum, the SBS threshold is increased compared to a conventional binary format. However, the duobinary format is not suitable for some systems applications.

Thus, a need remains in the art for an SBS reduction technique that can implemented with a simple, low voltage control signal, does not require special coding formats. and has low levels of residual AM.

SUMMARY OF THE INVENTION

This need is addressed in a broadband, tunable laser which includes an intracavity, integrated composite reflector to which a tuning voltage and a dither signal are applied. The tuning voltage provides coarse tuning of the center wavelength, whereas the dither signal provides for SBS reduction. In one embodiment the dither signal comprises a sinusoidal waveform; in another it comprises a triangular waveform.

The tunable laser provides an optical output signal in any one of N different longitudinal modes at wavelengths corresponding, for example, to the N channels of a WDM system. Illustratively, the laser comprises an MQW active region, a DFB region for selecting the nominal wavelength of stimulated emission (i.e., laser light) generated by the active region, and a first waveguide optically coupled to the active region to permit egress of the laser output signal. The tunable laser is characterized in that a composite second reflector is coupled to one end of the first waveguide so as to form a cavity resonator with the DFB region. In accordance with one aspect of our invention, the second reflector includes an MQW second region optically coupled to the MQW active region, a second waveguide having one end optically coupled to the first waveguide, and a high reflectivity dielectric layer disposed at the other end of the second waveguide. In order to tune the center wavelength of the laser light, a forward bias tuning voltage is applied to the MQW second region to induce changes in refractive index through the plasma effect. In order to reduce SBS, the dither signal is also applied to the MQW second region to broaden the spectrum of the output signal.

BRIEF DESCRIPTION OF THE DRAWINGS

Our invention, together with its various features and advantages, can be readily understood from the following more detailed description taken in conjunction with the accompanying drawing, in which.

Figure 1:
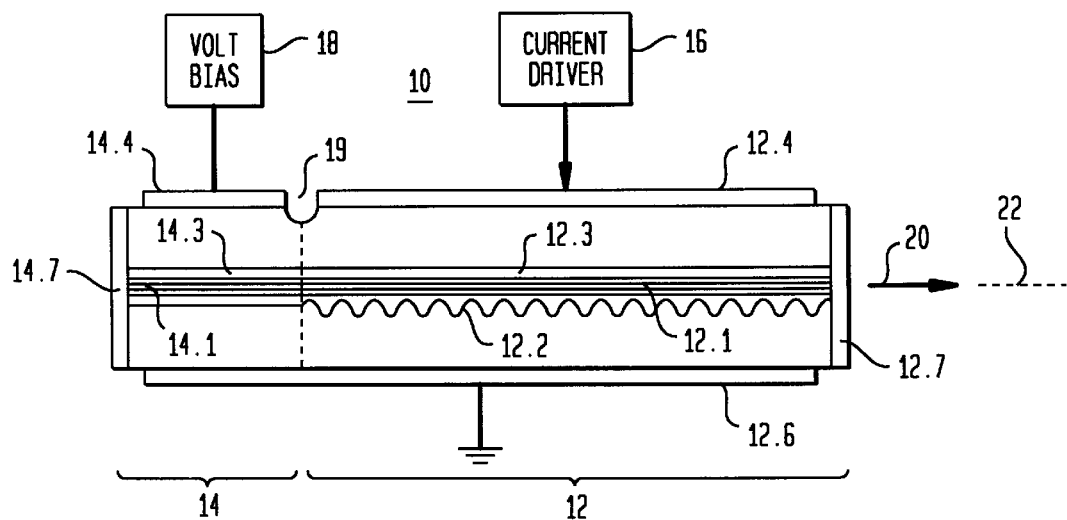
FIG. 1 is a schematic cross-sectional view of a tunable semiconductor laser in accordance with one embodiment of our invention.
Figure 2:
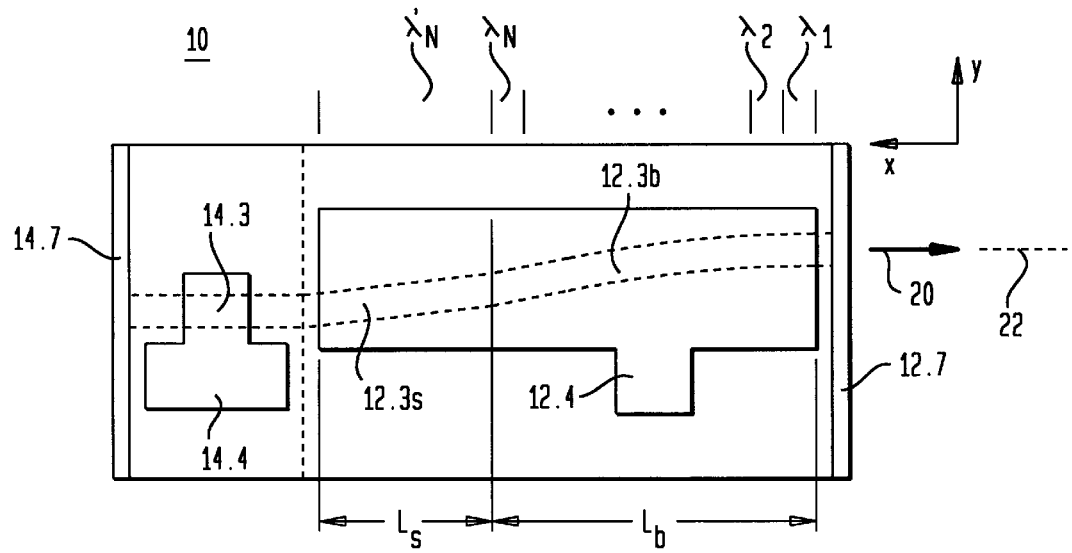
FIG. 2 is a schematic top view of the laser of FIG. 1.
Figure 3:
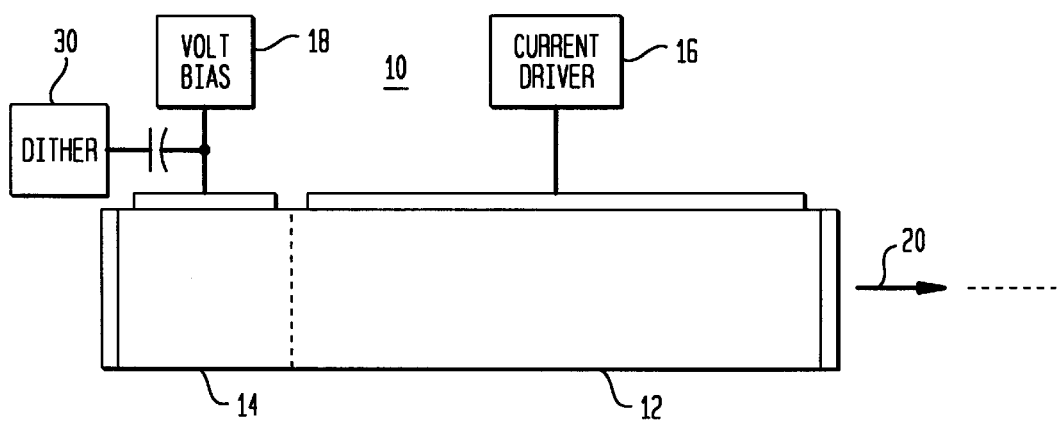
FIG. 3 is a schematic view of the laser of FIG. 1 in which a dither signal source 30 is coupled to the composite reflector section 14 in order to reduce SBS.

In the interests of simplicity and clarity, FIGS. 1–3 have not been drawn to scale.

DETAILED DESCRIPTION OF THE INVENTION

SBS Reduction

With reference now to FIG. 3, a broadband, tunable semiconductor laser 10 comprises a gain section 12 and an intracavity, integrated composite reflector section 14 arranged in tandem with one another. A current driver 16 supplies current to the gain section in order to generate a output signal 20. As described more fully hereinafter, a forward bias DC voltage supplied to reflector section 14 by bias source 18 coarsely tunes the center wavelength of the output signal by controlling the phase of the optical field within the laser cavity. In addition, the output signal is typically coupled to a transmission medium (not shown; e.g., a silica optical fiber) in which the signal tends to generate SBS. In order to reduce SBS in accordance with one aspect of our invention, a relatively low frequency, low voltage dither signal is also supplied to reflector section 14 in order to broaden the spectrum of the output signal and hence increase the SBS threshold. In general, the frequency of the dither signal should be much less than the bit rate of the output signal in digital applications and much less than the modulation frequency in analog applications.

EXAMPLE I

Sinusoidal Waveform Dither

As discussed above, the SBS threshold power is increased when the laser energy is distributed over a broader bandwidth. With our tunable laser, described in greater detail below, significant spectral broadening is achieved with relatively small amplitude (e.g. 5–100 mV), low frequency (e.g., 10–100 kHz) dither signals. The various parameters cited in the following experiments are provided by way of illustration only, and are not intended to limit the scope of the invention unless otherwise so stated explicitly.

Figure 4:
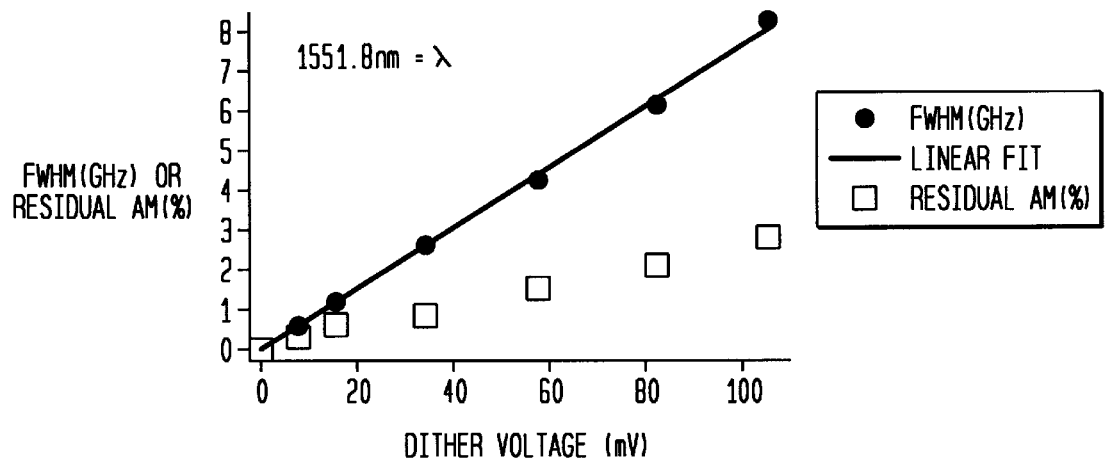
FIG. 4 is a graph of transmitted signal bandwidth (FWHM) and residual AM versus the voltage of the dither signal supplied by dither source 30 of FIG. 3.

The laser was tuned to provide an output signal at a wavelength of 1551.8 nm and was modulated with data at 2.5 GHz bit rate. In these experiments the dither signal was a sinusoidal waveform having peak-to peak voltage and frequency on the order of 100 mV and 100 kHz, respectively. The FWHM of the broadened spectrum of the output signal 20 of the laser 10 as function of dither signal peak-to-peak voltage is shown in FIG. 4, where the data closely follows a linear fit. The resulting residual AM as a function of dither signal voltage is also included. For example, a dither signal voltage of 107 mV broadened the spectrum to a FWHM of 7.9 GHz, resulting in an SBS threshold of 25.9 dBm. In contrast, with no dither signal applied the SBS threshold was 10.6 dBm. Thus, an increase in SBS threshold of 15.3 dBm was obtained in response to the relatively low amplitude dither signal. The corresponding residual AM was only 2.9%.

Figure 5:
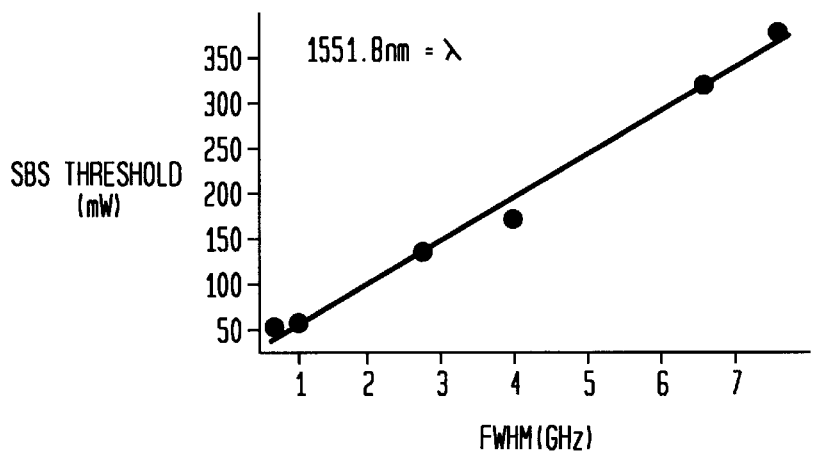
FIG. 5 is a graph of SBS threshold as a function of spectral width (FWHM)

The SBS threshold as a function of spectral width of the output signal 20 is plotted in FIG. 5, along with a linear fit to the data. As shown, the threshold increases from less than 50 mW at a spectral width less than 1 GHz to over 350 mW at spectral widths of nearly 8 GHz.

Channels at wavelengths other than 1551.8 nm show comparable spectral broadening with these relatively low amplitude dither signal voltages.

EXAMPLE II

Triangular Waveform Dither

Figure 6:
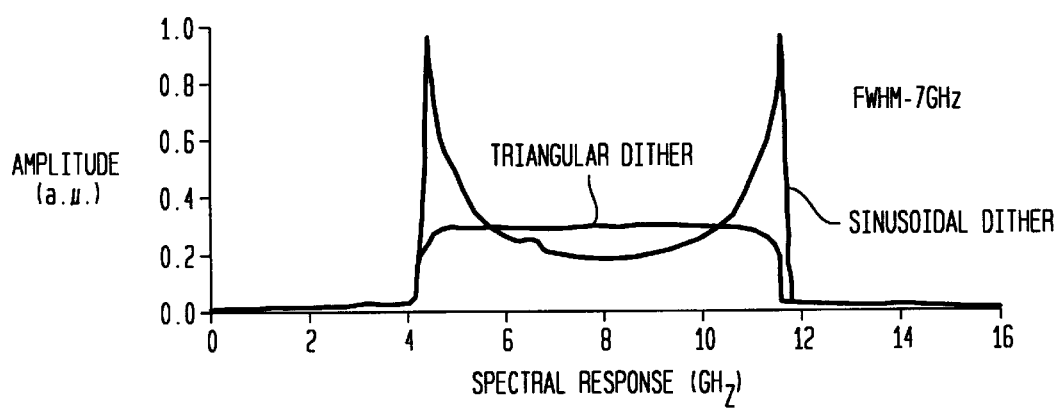
FIG. 6 is a graph comparing the spectrum of the transmitted signal as broadened by a sinusoidal waveform dither signal with that broadened by a triangular waveform dither signal. Amplitude on the ordinate is presented in arbitrary units (a.u.)

We performed experiments similar to Example I except that we substituted a triangular waveform dither signal (e.g., 100 kHz, 95 mV peak-to-peak) for the sinusoidal waveform. Comparable results were obtained in terms of spectral broadening (12 GHz), SBS threshold (25 dBm) and residual AM (1.2%). However, the energy distribution is much more nearly uniform for the case of the triangular waveform; the sinusoidal waveform produces definite spikes at each end of the spectrum and a bowed segment in the center. (Although the two spectra have the same integrated energy.). The more nearly uniform spectral distribution of the triangular waveform results in lower peak power. FIG. 6 shows the case for a spectral width of about 7 GHz.

Broadband Tuning

Turning now to FIGS. 1 and 2, we describe in greater detail the structure and operation of the broadband, tunable laser source 10 of FIG. 3. The source 10 generates an optical output signal 20 in any one of a plurality of N longitudinal modes each having a different wavelength $\lambda_i$ (i=1,2, . . . N). The output signal 20 propagates along a transmission axis 22 of, for example, a WDM system (not shown). The systems contemplated may embrace low speed applications (e.g., infrequent network reconfigurations) as well as relatively high speed applications (e.g., optical packet switches). In any case, the tunable source 10 comprises a cavity resonator formed by a gain section 12 and a composite reflector section 14.

The gain section 12 includes a relatively wide effective bandgap MQW active region 12.1, a DFB region 12.2 comprising a uniform pitch grating optically coupled to the active region, and a relatively narrower bandgap first waveguide 12.3 optically coupled to the active region. The output of the waveguide 12.3 is coupled to transmission axis 22 through a relatively low reflectivity dielectric layer (or composite of layers; e.g., an AR coating) 12.7. When current driver 16 supplies above-threshold forward bias current to the active region via electrodes 12.4 and 12.6, the laser source 10 generates light (radiation) at a wavelength determined by the composition and gain spectrum of the MQW region. In the absence of tuning mechanisms, the pitch of the DFB grating determines which longitudinal mode within the gain spectrum is selected. This mode is coupled into the first waveguide 12.3 and provides the laser output 20. As discussed later, any one of a plurality of N longitudinal modes at different wavelengths can be selected by modifying the laser design in accordance with various aspects of our invention.

In one aspect, the laser source 10 is provided with the composite reflector section 14 which, as indicated above, forms a cavity resonator with the gain section 12 (i.e., with the DFB region 12.2 ). More specifically, section 14 includes an MQW second region 14.1 optically coupled to the MQW active region 12.1, a second waveguide 14.3 having one end optically coupled to the first waveguide 12.3, and a relatively high reflectivity dielectric layer (or composite of layers; e.g., an HR coating) 14.7 disposed at the other end of the second waveguide 14.3.

In a second aspect shown in FIG. 2, the laser source 10 is provided with a first waveguide 12.3 having a predetermined shape (e.g., a raised-sine shape) which effectively segments the portion 12.3b of the waveguide 12.3 (i.e., the portion under electrode 12.4 ) into N zones corresponding to the N different wavelengths of WDM system (i.e., the channel wavelengths). These zones, labeled $\lambda_i$ (i=1,2 . . . N) in FIG. 2, each provide optical feedback at a different wavelength because the waveguide 12.3b has a different slope (i.e., relative to the grating lines) within each zone. However, continuous tuning over the range $\lambda_1$ to $\lambda_N$ is possible only if all of the longitudinal modes corresponding to these wavelengths have essentially the same threshold gains. This desideratum is achieved by a combination of the shape of the waveguide 12.3b (which determines the flatness of the gain spectrum of the modes) and the drive current (which determines the gain of the MQW active region 12.1). In addition, modes corresponding to zones in which the waveguide slope is larger experience higher loss. To compensate for the higher loss in the longest wavelength zone $\lambda_N$, which has the highest waveguide slope, the waveguide 12.3 is provided with a straight (i.e., linear) portion 12.3s disposed between the shaped portion 12.3b and the second waveguide 14.3 of the composite reflector section 14. Since the electrode 12.4 overlaps the portion 12.3s, the Nth mode is provided with additional gain to offset the higher losses (i.e., the zone for the Nth mode includes not only the region labeled $\lambda_N$ under electrode 12.3b in FIG. 2, but also the region labeled $\lambda_N$ under electrode 12.3s).

The shape y(x) of the waveguide portions 12.3b and 12.3s and their corresponding grating pitch functions $\Lambda(x)$ can be described by a set of equations as follows. In the range $L_s \leq x \leq L_B$ the shape of the waveguide 12.3b follows essentially a raised-sine shape given by $$y_b = W + (W/L_b)(2L_s - x) + (W/\pi)\sin(\pi x/L_b) \quad (1)$$

where x is distance along the direction of light propagation (e.g., along transmission axis 22 ), W is the maximum displacement of y(x) from axis 22 in the case where the straight portion 12.3s is omitted, $L_s$ is the length of the straight waveguide portion 12.3s, and $L_b$ is the length of the shaped waveguide portion 12.3b. The corresponding grating pitch is given by $$\Lambda_b = \Lambda_0[1 + (W/L_b)^2(\cos\pi x/L_b - 1)^2]^{1/2} \quad (2)$$

where $\Lambda_0$ is the pitch of the uniform grating of the DFB region 12.2. In contrast, in the range $L_b \leq x \leq (L_b + L_s)$ the shape of the waveguide 12.3s follows a straight line function given by $$y_s = 2W + (2W/L_b)(L_s - x) \quad (3)$$

whereas the grating pitch is given by $$\Lambda_s = \Lambda_0[1 + (2W/L_b)^2]^{1/2} \quad (4)$$

Although the combination of a raised-sine function and a straight line function for the two waveguide segments is preferred, other functions can be utilized depending on the particular application contemplated.

In a third aspect of our invention, the laser source 10 is provided with means for applying an electrical control signal to the composite reflector section 14 which effectively alters the phase of light propagating in the second waveguide 14.3 and hence in the laser source as a whole. Illustratively, an electrical signal from source 18 is applied to section 14 via electrodes 14.4 and 12.6. The control signal may take on several forms (i.e., current or voltage), but for high speed applications it is preferably a reverse bias voltage which induces the Quantum Confined Stark Effect (QCSE) in the MQW second region 14.3. The QCSE, in turn, induces changes in the refractive index of the MQW region 14.3 and hence in the phase of the light propagating in the second waveguide 14.3. On the other hand, for SBS reduction, particularly with low levels of residual AM, the control signal is preferably a forward bias voltage which induces refractive index changes via the plasma effect. Therefore, by varying the applied voltage the laser source 10 can be tuned over a relatively broad range of wavelengths corresponding the wavelengths spanned by the N zones of the first waveguide 12.3.

In general, varying only a single parameter, such as the control voltage level applied to the composite reflector section 14 enables the wavelength of the laser source to be tuned over a moderately broad range (e.g., about 2 nm) at relatively high speeds (e.g., 50–100 ps). However, varying several parameters, such as the control voltage level, the drive current and the temperature of the laser, enables tuning over a much broader wavelength range (e.g., 10–12 nm), albeit at more modest speeds (e.g., in the millisecond to nanosecond range).

The following examples demonstrate the efficacy of our invention for both relatively low speed and relatively high speed applications. The various materials, dimensions, operating conditions and other parameters are provided by way of illustration only, and are not to be construed as limitations on the scope of the invention unless expressly so indicated.

EXAMPLE III

Low Speed Tuning

A laser source 10 was fabricated using selective area growth MOVPE to grow the various semiconductor layers and standard processing to etch shapes, deposit electrodes and the like. The MQW regions 12.3 and 14.3 comprised 7 layers of strained InGaAsP (1.55 μm bandgap) interleaved with barrier layers of InGaAsP (1.28 μm bandgap). Transverse mode control was accomplished by forming a 1 μm wide well-known CMBH structure. InP:Fe current blocking layers 3 μm thick were formed on either side of the CMBH structure in order to reduce leakage current and parasitic capacitance. A shallow groove 19 about 80 μm long was used to enhance electrical isolation with a typical resistance of 25 kΩ. The waveguides 12.3b and 12.3s had shapes defined essentially by equations (1) and (3) above and were designed to provide gain in eight longitudinal modes corresponding to eight channels (each about 1.4 nm wide) of a WDM system at wavelengths ranging from 1549.4 to 1560.7 nm.

We were able to tune the laser source through all eight channels (over more than an 11 nm range) by appropriate choice of bias voltage, drive current and temperature. The typical power delivered into a single mode fiber was 10 mW at a drive current of 60 mA. The mean side mode suppression ratio was about 36 dB. The following table illustrates how the three parameters were varied to achieve tuning over a relatively broad 11 nm range.

| CHANNEL NO. | WAVELENGTH (nm) | TEMPERATURE (° C.) | BIAS VOLTAGE (V) | DRIVE CURRENT (mA) |
| --- | --- | --- | --- | --- |
| 1 | 1549.42 | 25 | −1.80 | 60 |
| 2 | 1551.02 | 25 | 0.00 | 60 |
| 3 | 1552.63 | 25 | 0.00 | 70 |
| 4 | 1554.25 | 25 | 1.10 | 170 |
| 5 | 1555.86 | 25 | 1.73 | 320 |
| 6 | 1557.47 | 35 | 1.67 | 300 |
| 7 | 1559.09 | 45 | 2.30 | 290 |
| 8 | 1560.72 | 50 | 2.40 | 290 |

This low speed tuning range of 11 nm is more than double the best result reported in the prior art (Cf. H.Hillmer et al., *IEEE J. Selected Topics in Quantum Electronics*, Vol. 1, No. 2, pp. 356–362 (1995); incorporated herein by reference).

EXAMPLE IV

High Speed Tuning

A laser source similar to the one described in Example III was utilized to demonstrate single parameter, high speed tuning over a relatively broad wavelength range. The single parameter varied was the bias voltage applied to the composite reflector section 14. When driven with a bias voltage having a 350 ps period, the laser output tuned back and forth between high (1551.7 nm) and low (1550.0 nm) wavelengths at the same rate. The output switched from short to long wavelength over a 1.7 nm range in 56 ps and switched back in 134 ps (10% to 90% rise time). The side mode suppression ratio was about 35 dB during tuning. This high speed tuning range is nearly an order of magnitude better than that previously reported by the prior art (Cf., H. Nakajima et al, *OFC Technical Digest*, p. 276 (1996); incorporated herein by reference). High speed switching between four channels (channel spacing 0.7 nm) was also demonstrated using a 4-level bias voltage. The ability of our tunable laser source to address multiple WDM channels and to switch between them at very high speeds should enable optical routing on a cell-by-cell basis in a WDM network without requiring large guard times.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. For example, in long distance transmission systems a narrow linewidth laser source is particularly important because fiber dispersion tends to increase pulse width. But, spatial hole burning in the laser, which can be caused by non-uniform current drive, tends to increase linewidth. Therefore, it is particularly advantageous that the drive current be applied substantially uniformly to the MQW active region 12.1. To this end, it is preferable that the electrode 12.4 be a single, non-segmented electrode and, likewise, that the active region 12.1 be a single, non-segmented region. By employing these features in our invention we were able to obtain linewidths of 1–2 MHz, which we expect would be an order of magnitude improvement compared to prior art segmented designs (Cf., Hillmer et al. and Nakajima et al., supra).

Figure 7:
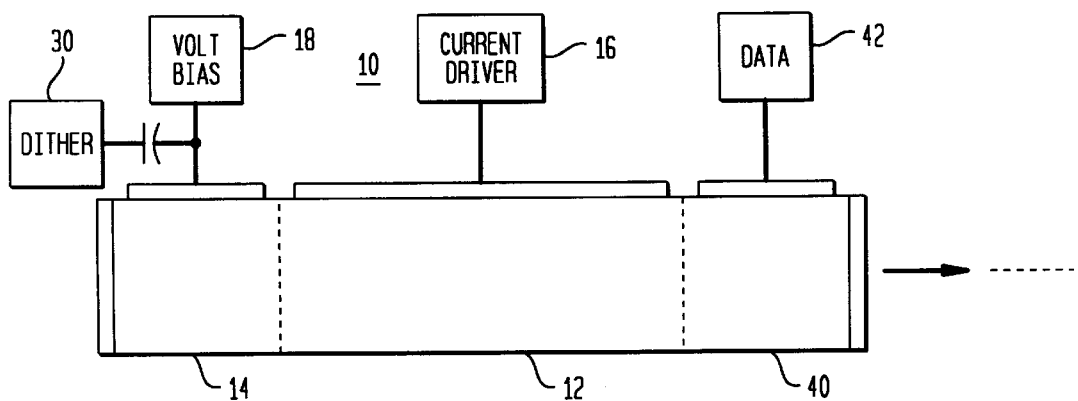
FIG. 7 is schematic of an optical integrated circuit transmitter in accordance with another aspect of our invention.

In addition, the output of the tunable laser may be modulated. Thus, as shown in FIG. 7, we have fabricated an integrated optical circuit including an external (i.e., extracavity) modulator 40, in particular an electroabsorption modulator, and a tunable laser of the type previously described. Data from source 42 was imposed on the laser output in the form of AM (i.e., on-off keying). In this fashion, the multiple fuinctions of SBS reduction, data modulation and wavelength tuning among WDM channels may be realized with a single integrated device.

What is claimed is:

1. A laser transmitter comprising
    a tunable laser source for delivering to an optical fiber an optical output signal in any one of N different longitudinal modes, said source including
        a gain section including an MQW active region, a DFB region optically coupled to said active region for selecting the nominal wavelength of the longitudinal mode which lases, and a first waveguide optically coupled to said active region to permit egress of the laser output signal,
        a composite reflector optically coupled to one end of said first waveguide so as to form a cavity resonator with said DFB region, said composite reflector including an MQW second region optically coupled to said MQW active region, a second waveguide having one end optically coupled to said first waveguide, and a relatively high reflectivity dielectric layer disposed at the other end of said second waveguide,
        first tuner means for applying a tuning voltage to said MQW second region to induce therein changes in refractive index, thereby to alter the center wavelength of said output signal, and driver means for applying drive current to said active region, and
        the current applied to said active region and the shape of said first waveguide being mutually adapted so that said N longitudinal modes have essentially the same threshold gain and so that a portion of said DFB region spanned by said first waveguide is segmented into N zones, each zone providing optical feedback at a different wavelength corresponding to a different one of said longitudinal modes, and
    a dither source for applying to said MQW second region a dither signal effective to broaden the spectrum of said output signal, thereby to reduce SBS in said fiber.

2. The invention of claim 1 wherein said dither signal has a triangular waveform.

3. The invention of claim 1 further including a modulator for impressing information on said output signal, and wherein the frequency of said dither signal is much less than the bit rate of said modulated output signal when said modulator is a digital system modulator and much less than the modulation frequency when said modulator is an analog system modulator.

4. The invention of claim 3 wherein said modulator comprises an electroabsorption modulator integrated with said laser.

5. The invention of claim 1 wherein said first portion has a raised-sine function of the form defined by equation (1).

6. The invention of claim 1 wherein said active region is a single, non-segmented region and further including a single, non-segmented second electrode for applying said drive current thereto in a substantially uniform manner.

7. The invention of claim 1 wherein said tuning voltage forward biases said composite reflector, thereby to induce refractive index changes therein via the plasma effect and to reduce residual AM in said output signal.

* * * * *